United States Patent [19]

Meguro

[11] 4,268,321
[45] May 19, 1981

[54] METHOD OF FABRICATING A SEMICONDUCTOR DEVICE HAVING CHANNEL STOPPERS

[75] Inventor: Satoshi Meguro, Kodaira, Japan
[73] Assignee: Hitachi, Ltd., Tokyo, Japan
[21] Appl. No.: 69,062
[22] Filed: Aug. 23, 1979

[30] Foreign Application Priority Data

Aug. 23, 1978 [JP] Japan .............................. 53/101791

[51] Int. Cl.³ .......................................... H01L 21/26
[52] U.S. Cl. .................................. 148/1.5; 148/187; 29/571; 357/42
[58] Field of Search .................. 148/1.5, 187; 29/571; 357/42

[56] References Cited

U.S. PATENT DOCUMENTS

| | | | |
|---|---|---|---|
| 3,913,211 | 10/1975 | Seeds et al. | 148/174 X |
| 3,983,620 | 10/1976 | Spadea | 29/571 |
| 4,027,380 | 6/1977 | Deal | 29/571 |
| 4,047,285 | 9/1977 | Spadea | 29/571 |
| 4,081,896 | 4/1978 | Dingwall | 29/571 |
| 4,110,899 | 5/1978 | Nagasawa et al. | 29/571 |
| 4,170,492 | 10/1979 | Bartlett et al. | 148/1.5 |

OTHER PUBLICATIONS

IBM Tech. Discl. Bull., vol. 16, No. 5, Oct. 1973, pp. 617 and 617a.

Primary Examiner—G. Ozaki
Attorney, Agent, or Firm—Craig & Antonelli

[57] ABSTRACT

A method of fabricating complementary insulated gate field effect transistors of LOCOS (Local Oxide of Silicon) construction comprising the steps of selectively forming an $SiO_2$ film on an N type semiconductor substrate, introducing P type impurities in the substrate through the substrate surface which is not covered with the $SiO_2$ film so as to form a P type well region, selectively forming $Si_3N_4$ films on the P type well region, introducing P type impurities in the P type well region through the region surface which is not covered with the $Si_3N_4$ film to form a $P^+$ type channel stopper, and selectively forming a field oxide film on the $P^+$ type channel stopper by using the $Si_3N_4$ film as the oxide mask. The method can also include steps for forming an $N^+$ type channel stopper under the field oxide film.

16 Claims, 22 Drawing Figures

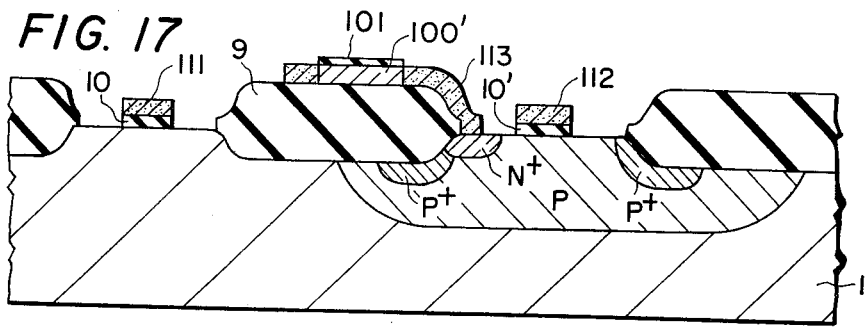
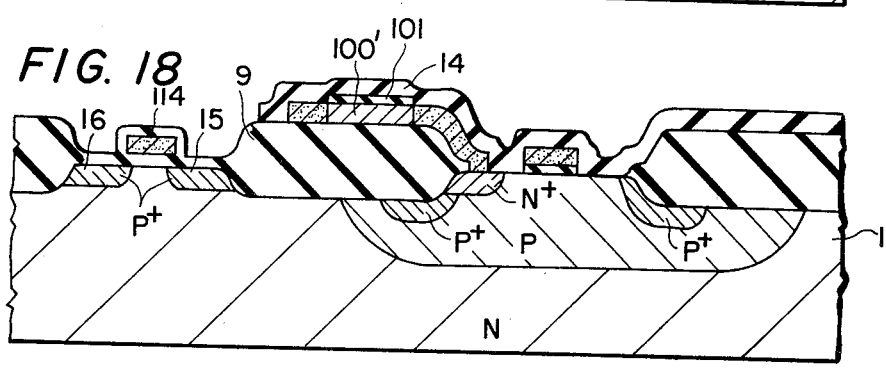
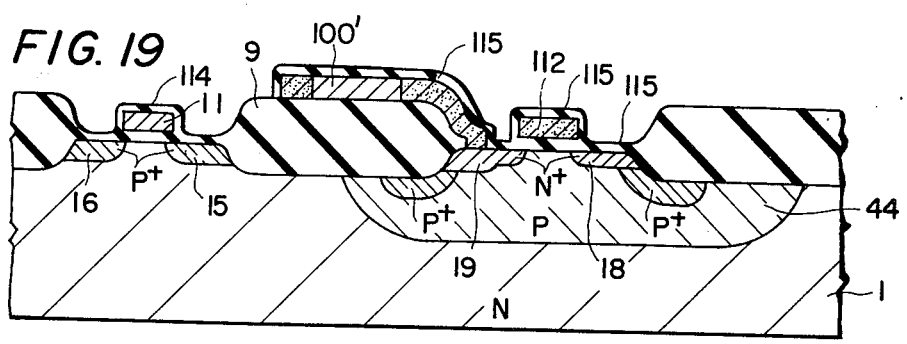
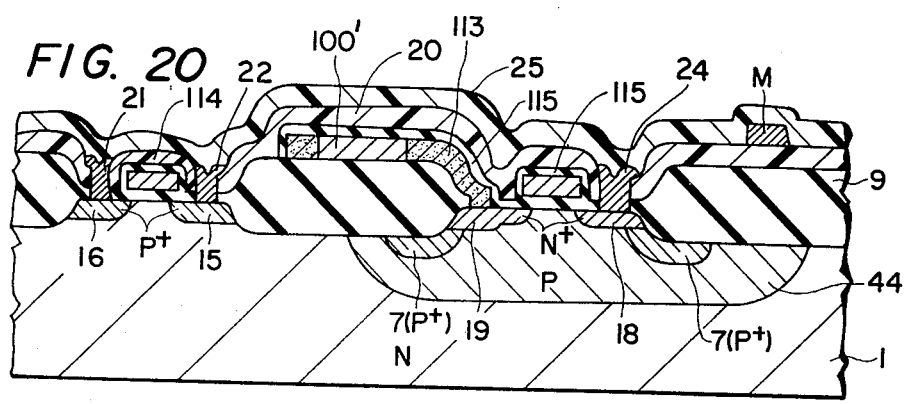

METHOD OF FABRICATING A SEMICONDUCTOR DEVICE HAVING CHANNEL STOPPERS

BACKGROUND OF THE INVENTION

The present invention relates to a method of fabricating a semiconductor device and, more particularly, to a method of fabricating a complementary insulated gate field effect transistor (referred to as CIGFET, hereinafter) of LOCOS (Local Oxide of Silicon) construction.

Semiconductor memory devices of LOCOS construction constituted by CIGFETs are well known. In such semiconductor memory circuit devices, a multiplicity of wiring layers are formed on a thick oxide film (referred to as the field oxide film, hereinafter) for isolation between transistors. The threshold voltage of the parasitic metal-insulator-semiconductor field effect transistor (referred to as the parasitic MISFET, hereinafter) formed with the gate constituted by these wiring layers is one of the most critical features which limit the operation voltage of the semiconductor memory circuit device. Namely, if the threshold voltage of the parasitic MISFET is low, it is necessary to use a low power supply voltage. Consequently, the use of the semiconductor device is undesirably limited.

It has been previously proposed, therefore, to form a channel stopper just beneath the field oxide film to increase the threshold voltage of the parasitic MISFET as in, for example, the specification of U.S. Pat. No. 4,110,899. According to the technique disclosed in this Patent for forming the channel stopper, it is possible to partly make use of the mask ($Si_3N_4$) for forming the field oxide film. Therefore, the technique disclosed in this prior Patent offers an advantage of higher density of integration than the conventional method for forming a channel stopper in an ordinary planar CMISFET. However, this technique requires steps of treatment with photoresist masks, for selectively forming channel stoppers of different conduction types on the substrate surface and on the well regions. Accordingly, the treatment with photoresist masks in turn requires a highly precise alignment of the masks. For these reasons, the process in accordance with the technique disclosed in the aforementioned Patent is undesirably complicated.

SUMMARY OF THE INVENTION

It is an object of the present invention to precisely form semiconductor regions in a semiconductor substrate without necessitating an additional number of steps in the production process.

It is another object of the invention to provide a process for producing a semiconductor device which effectively suppresses the generation of the parasitic MISFET to permit the use of any desired power supply voltage.

To these ends, according to the invention, there is provided a method of fabricating a semiconductor device having the steps of introducing P type impurities into an N type semiconductor substrate through a mask of an oxide film so as to form a P type well region which makes a PN junction with the substrate, selectively forming an oxidation prevention film on the P type well region, and introducing P type impurities through the masks of the above-mentioned oxide film and the oxidation prevention film so as to form a P+ type region having a surface impurity concentration higher than that of the P type well region. According to this method, the P+ region is automatically located with respect to the PN junction on the substrate surface due to the use of the oxidation film as the P type well region and the P+ type region.

BRIEF DESCRIPTION OF THE DRAWINGS

FIGS. 11 to 20 are sectional views of a semiconductor device showing the steps of the process in accordance with a second embodiment of the method of the invention;

DESCRIPTION OF THE PREFERRED EMBODIMENTS

Embodiment 1

Hereinafter, an explanation will be made as to the method of the invention for fabricating a CIGFET of LOCOS construction in accordance with the technical idea of the present invention, with specific reference to FIGS. 1 to 10.

Figure 1:
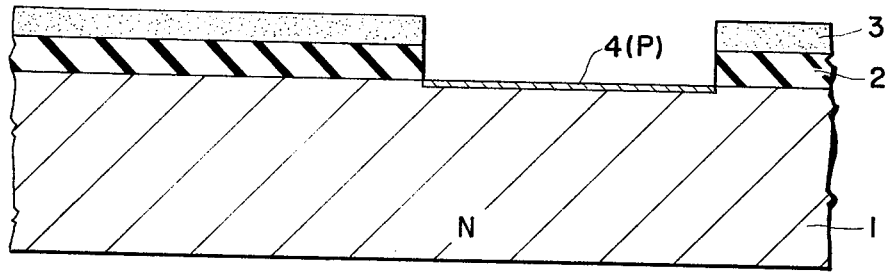
FIGS. 1 to 10 are sectional views of a semiconductor device showing the steps of the process in accordance with a first embodiment of the method of the invention.

(1) Referring first to FIG. 1, a silicon oxide ($SiO_2$) film 2 of about 1000 Å thick is formed on an N-type silicon (Si) substrate 1 having an impurity concentration of 0.5 to $1.0 \times 10^{15}$ atoms/$cm^3$. A photoresist film 3 having a predetermined pattern is formed on this $SiO_2$ film 2. The $SiO_2$ film 2 is selectively etched making use of the photoresist film 3 as an etching mask so as to expose a part of the Si substrate 1. Then, ions of boron impurities ($BF_2$ ions) are implanted on the exposed surface of the Si substrate 1 at an acceleration voltage of 75 KeV, while leaving the photoresist film 3 on the $SiO_2$ film 2, thereby to form a P type region 4. The dosage of the impurity ions is preferably $4 \times 10^{12}$ to $8 \times 10^{12}$ atoms/$cm^2$.

Figure 2:
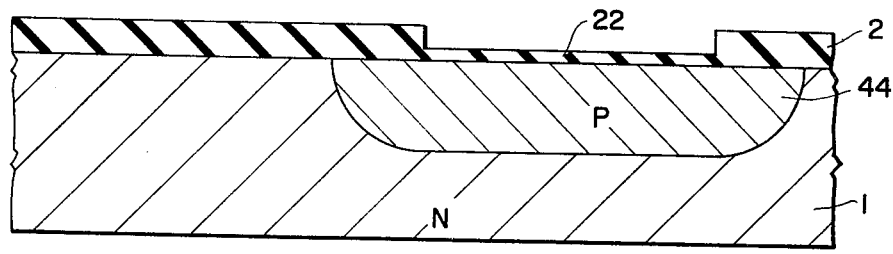

(2) As shown in FIG. 2, after removing the photoresist film 3, the surface of the P type region 4 is oxidized to form an $SiO_2$ film 22 of 330 Å thick. Then, the Si substrate 1 is heated in an $N_2$ atmosphere at 1200° C. for about 6 hours, so as to diffuse the P type region 4. In consequence, a P type well region 44 of 4 to 8μ deep is formed.

Figure 3:
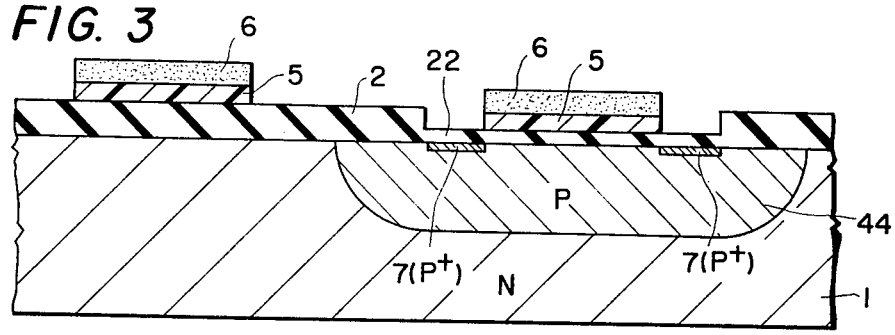

(3) In FIG. 3, an oxidation prevention film such as silicon nitride ($Si_3N_4$) film 5 is formed by a vapor growth method on the $SiO_2$ films 2 and 22. Then, the $Si_3N_4$ film 5 is selectively etched making use of a photoresist film 6 as an etching mask. This etching can be achieved by plasma etching making use of $CF_4$. Then, while leaving the photoresist film 6 in place, the $BF_2$ ions are implanted into the surface of the Si substrate 1. The dosage of the ion implant is preferably $2 \times 10^{13}$ to $5 \times 10^{13}$ atoms/$cm^2$. The portion of the surface of the substrate 1 coated by the photoresist film 6 and the $Si_3N_4$ film 5 are completely shielded and are never reached by the ions. In addition, since the $SiO_2$ film 2 has a thickness of about 1000 Å, the amount of ions passing through the $SiO_2$ film 2 is as small as 0.1 to 1% of the total ions in the ion beam. On the other hand, since the thickness of the $SiO_2$ film 22 is as small as about 330 Å, the amount of the ions passing through this film 22 is as large as 70 to 95% of the ions in the ion beam. In consequence, P+ type channel stoppers 7 are selectively formed in the surface of the P type well region 44 just beneath the portion of the thin SiO$_2$ film 22 surrounded by the thick SiO$_2$ film 2 and the Si$_3$N$_4$ film 5.

Figure 4:
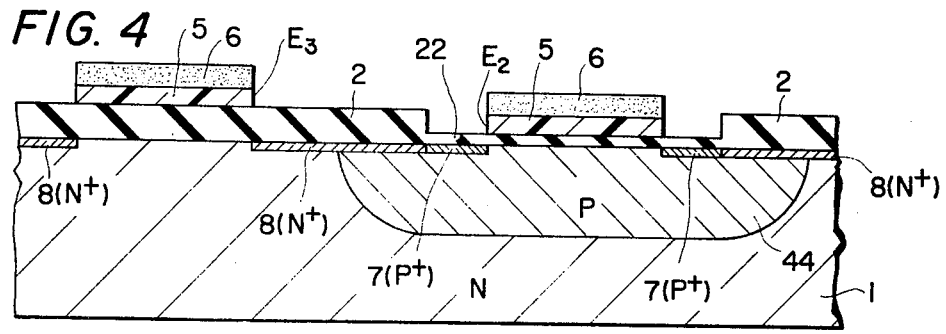

(4) Referring now to FIG. 4, ions of phosphorus impurities are implanted into the surface of the Si substrate 1 at an acceleration voltage of 120 to 150 KeV, which is higher than that for the boron ions discussed above. The dosage of the ion implant is preferably $3 \times 10^{11}$ to $5 \times 10^{11}$ atoms/cm$^2$. The portions of the surface of the Si substrate 1 coated by the photoresist film 6 and the Si$_3$N$_4$ film 5 is completely shielded against the phosphorus ions and is never reached by these ions. On the other hand, ions amounting to 90 to 98% of the ions in the ion beam are implanted into the surface of the Si substrate 1 through the SiO$_2$ films 2 and 22. As a result, N+ type channel stoppers 8 are selectively formed in the surface of the P type well region 44 and the surface of the Si substrate 1 immediately beneath the thick SiO$_2$ film 2 which is not covered by the Si$_3$N$_4$ film 5 and the photoresist film 6. The phosphorus ions are implanted also into the P+ type channel stoppers 7 just beneath the thin SiO$_2$ film 22 surrounded by the thick SiO$_2$ film 2 and the Si$_3$N$_4$ film 5. However, since the P+ type channel stopper 7 has been formed by implantation of a large quality of ions, it is not erased by the phosphorus ions.

Figure 5:
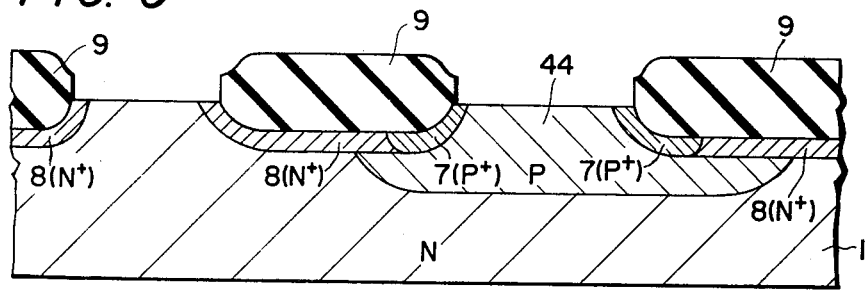

(5) As shown in FIG. 5, after the removal of the photoresist film 6, the Si substrate 1 is heated in an O$_2$ atmosphere at 1000° C. for about 2 hours so as to diffuse the P+ type channel stoppers 7 and the N+ type channel stoppers 8. The surface impurity concentrations of the P+ type channel stoppers 7 and the N+ type channel stoppers 8 after the diffusion are $2 \times 10^{13}$ to $5 \times 10^{13}$ atoms/cm$^2$ and $4 \times 10^{12}$ atoms/cm$^2$, respectively. Further, the Si substrate 1 is heated in a wet O$_2$ atmosphere at a temperature of 1000° C., for about 4 hours. As a result, the SiO$_2$ films 2 and 22 which are not coated by the Si$_3$N$_4$ film 5 are rendered thicker so as to form a field oxide film 9 (SiO$_2$ film) of 0.9 to 1.4$\mu$ thick for isolation between the transistors. Namely, a field oxide film 9 with a mask constituted by the Si$_3$N$_4$ film 5 is formed. Thereafter, the Si$_3$N$_4$ film 5 and the thin SiO$_2$ film 22 is removed to expose the surfaces of the Si substrate 1 and the P type well region 44.

Figure 6:
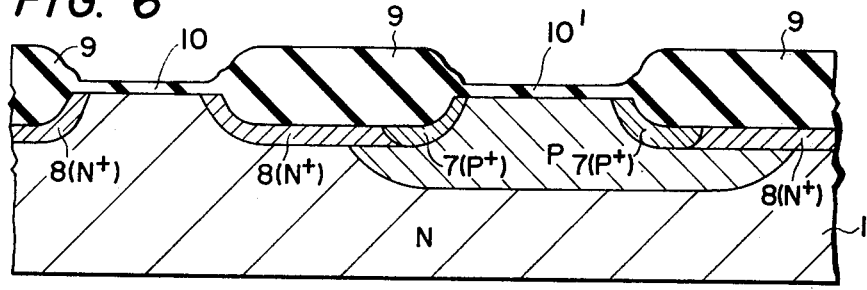

(6) In FIG. 6, SiO$_2$ films 10 and 10' are formed on the exposed Si substrate 1 as the gate insulation film. These SiO$_2$ films 10 and 10' preferably have thicknesses of about 500 to 1000 Å, preferably 530 Å.

Figure 7:
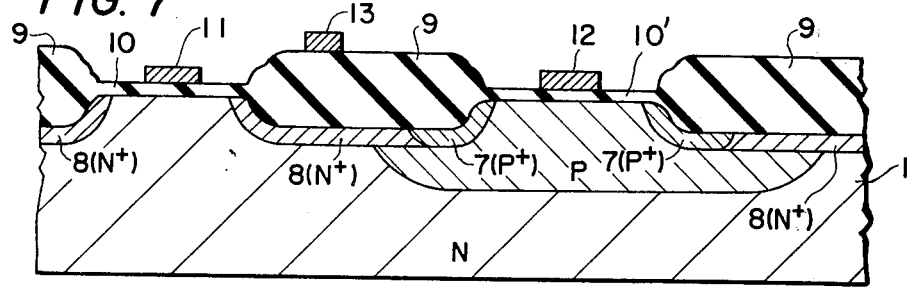

(7) Subsequently, as shown in FIG. 7, gate electrodes 11 and 12 and conduction layer 13, all consisting of polycrystalline Si, are formed. The electrodes 11, 12 and the conduction layer 13 are respectively formed by a polycrystalline Si layer on the SiO$_2$ films 10 and 10' and the field oxide film 9.

Figure 8:
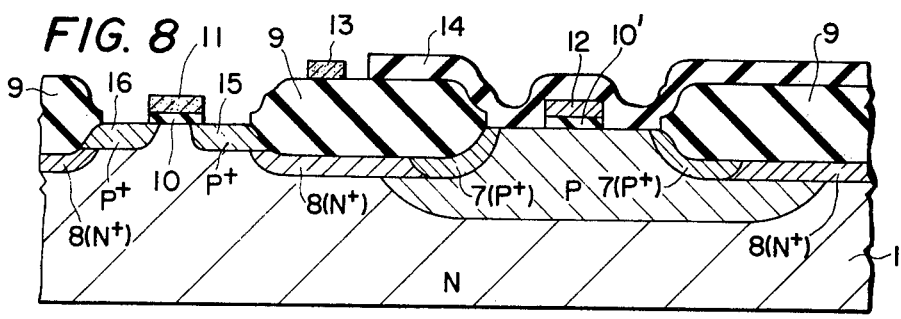

(8) Referring now to FIG. 8, to expose the portion of the surface of the Si substrate 1 where the source and the drain regions are to be formed and also the surface of the P type well region 44, the Si substrate 1 is subjected to an etching liquid for the SiO$_2$ film, so as to completely etch the portions of the thin SiO$_2$ films 10 and 10' other than the portions beneath the gate electrodes 11 and 12. Namely, the thin SiO$_2$ films 10 and 10' are etched by making use of the gate electrodes 11 and 12 as the etching masks. The field oxide film 9 is etched simultaneously. However, since the film 9 is sufficiently thick, this film can provide a mask effect in the etching of the thin SiO$_2$ films 10 and 10'. Then, only the portion where the N channel MISFET is to be formed is coated by means of an SiO$_2$ film 14 1500 Å thick.

Subsequently, the exposed portion of the surface of the Si substrate 1 where the source and the drain regions are to be formed are coated with impurities such as boron impurities deposited thereon, the impurities are then diffused into the Si substrate 1.

In consequence, the source and drain regions 15 and 16 of the P channel MISFET are formed.

During the deposition of the P type impurities, the gate electrode 11 and the conduction layer 13 are doped with P type impurities. It is therefore possible to sufficiently lower the rate of resistance of the gate electrode 11 and the conduction layer 13.

After the formation of the source and the drain regions 15 and 16, the surfaces of these regions 15 and 16, gate electrode 11 and the conduction layer 13 are oxidized in a wet O$_2$ atmosphere to a temperature of about 830° C.

Figure 9:
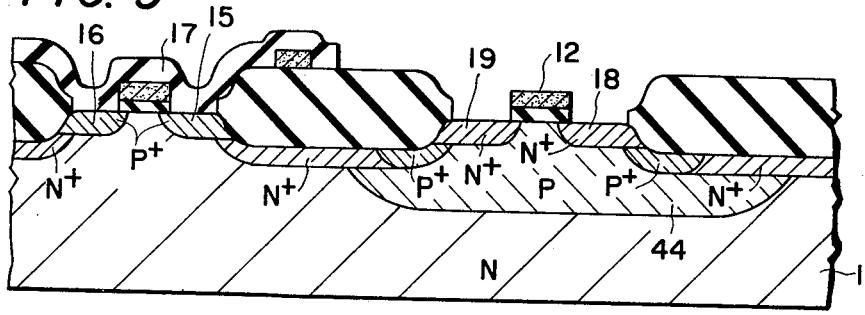

(9) After the removal of the SiO$_2$ film 14, the gate electrode 11, source and drain regions 15 and 16, conduction layer 13 and a part of the field oxide film 9 are coated with a SiO$_2$ film 17 1500 Å thick as shown in FIG. 9. The gate electrode 12 and the portions of the surface of the Si substrate 1 where the source and drain regions are to be formed for the N-channel MISFET in conjunction with the gate electrode 12 are not coated with this SiO$_2$ film 17.

Thereafter, N type impurities such as phosphorus impurities are deposited on the exposed portion of surface of the P type well region 44 where the source and drain regions for the N-channel MISFET are to be formed, and are diffused through the P type well region 44. As a result, N+ type source and drain regions 18 and 19 of an N channel MISFET are formed.

During the deposition of the N type impurities, the N type impurities are also doped into the gate electrode 12. It is therefore possible to sufficiently lower the resistance value of the gate electrode 12.

After the formation of the source and drain regions 18 and 19, the surfaces of these regions 18 and 19 are oxidized in a wet O$_2$ atmosphere of about 830° C.

Figure 10:
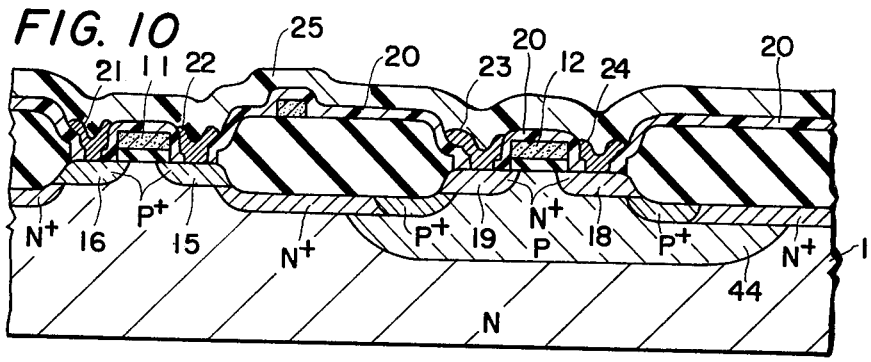

(10) After coating the surface of the substrate 1 with phosphosilicate glass (PSG) film 20, as shown in FIG. 10, the PSG film 20 on the source and drain regions 15, 16, 18 and 19 is selectively etched to form windows for contacts. Then, an aluminum film 1$\mu$ thick is formed on the Si substrate 1 by way of a vacuum evaporation. Then, this aluminum layer is selectively etched to form the drain electrodes 21 and 23, source electrodes 22 and 24, and a conduction layer which is not shown. Then, the Si substrate 1 is subjected to an annealing at 450° C. for about 60 minutes to form a passivation film (PSG film) 25 on the upper surface of the Si substrate 1.

Although not shown in FIG. 10, the gate electrodes 11 and 12 are connected as desired to the aluminum conduction layer.

According to the CIGFET obtained by the above-described method, the threshold voltage of the P channel MISFET constituted by the source and drain regions 15, 16 and the gate electrode 11 is about 0.5 V, while the threshold voltage constituted by the source and drain regions 18 and 19 and the gate electrode 12 is about 0.5 V. Therefore, the threshold voltages of the parasitic MISFET formed beneath electrode wirings were 10 to 15 V at both the P channel MISFET portion and the N channel MISFET portion, respectively.

Embodiment 2:

A method of fabricating a CIGFET of LOCOS construction other than the CIGFET as obtained by the embodiment 1, in accordance with the technical idea of the invention, will be described hereinunder with specific reference to FIGS. 11 to 20.

Figure 11:
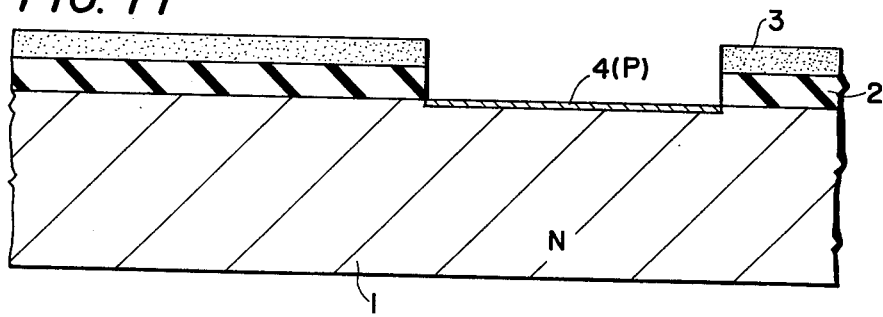

(1) Referring to FIG. 11, a SiO$_2$ film 2 of about 1000 Å thick is formed on the surface of the N type substrate 1 having the impurity concentration of $0.5 \times 10^{15}$ to $1.0 \times 10^{15}$ atoms/cm$^2$. Then, a photoresist film 3 having a predetermined pattern is formed on the SiO$_2$ film 2. The SiO$_2$ film 2 is then selectively etched by making use of the photoresist film 3 as an etching mask, so as to partially expose the surface of the Si substrate 1. Then, while leaving the photoresist film 3, boron impurities ions (BF$_2$ ions) are implanted into the surface of the Si substrate 1 at an acceleration voltage of 75 KeV so as to form a P type region 4. The dosage of this ion implantation is preferably $4 \times 10^{12}$ to $8 \times 10^{12}$ atoms/cm$^2$.

Figure 12:
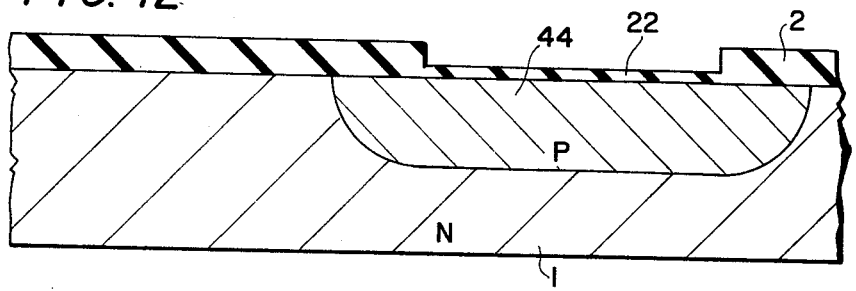

(2) After the removal of the photoresist film 3, as shown in FIG. 12, the surface of the P type region 4 is oxidized to form an SiO$_2$ film 22 of 330 Å thick, and thereafter, the Si substrate 1 is heated at 1200° C. in an N$_2$ atmosphere for about 6 hours, so as to spread and diffuse the P type region 4. In consequence, a P type well region 44 of 4 to 8μ deep is formed.

Figure 13:
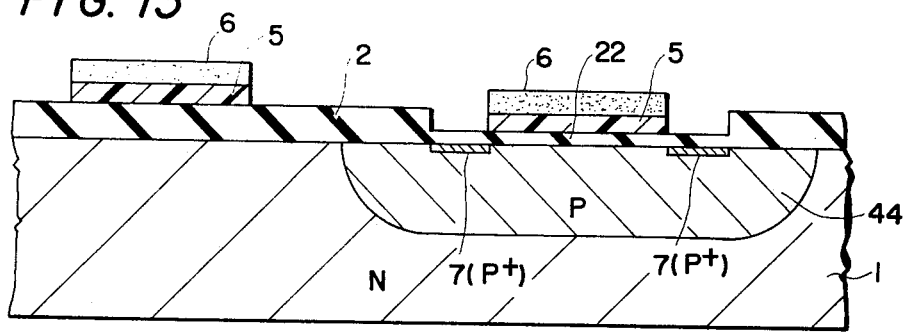

(3) An oxidation prevention film 5 such as of Si$_3$N$_4$ is formed on the SiO$_2$ films 2 and 22 as shown in FIG. 13. Then, the Si$_3$N$_4$ film 5 is selectively etched making use of the photoresist film 6 having the specific pattern as the etching mask. This etching is achieved by a plasma etch making use of CF$_4$. Then, while leaving the photoresist film 6, the BF$_2$ ions are implanted into the surface of the Si substrate 1. The dosage of the ion is preferably $2 \times 10^{13}$ to $5 \times 10^{13}$ atoms/cm$^2$. The portions of Si substrate 1 covered by the photoresist film 6 and the Si$_3$N$_4$ film 5 are completely shielded and are not reached by the ions.

(4) Since the SiO$_2$ film 2 has a thickness which is as large as about 1000 Å, the amount of ions which are allowed to pass through the SiO$_2$ film 2 is as small as 0.1 to 1% of the total ions in the ion beam. On the other hand, since the thickness of the SiO$_2$ film 22 is only about 330 Å thick, the amount of ions passing through the SiO$_2$ film 22 is as large as 70 to 95% of the ions in the ion beam. In consequence, P+ type channel stoppers 7 are formed in the surface of the P type well region 44 just beneath the thin SiO$_2$ film 22 surrounded by the thick SiO$_2$ film 2 and the Si$_3$N$_4$ film 5.

Figure 14:
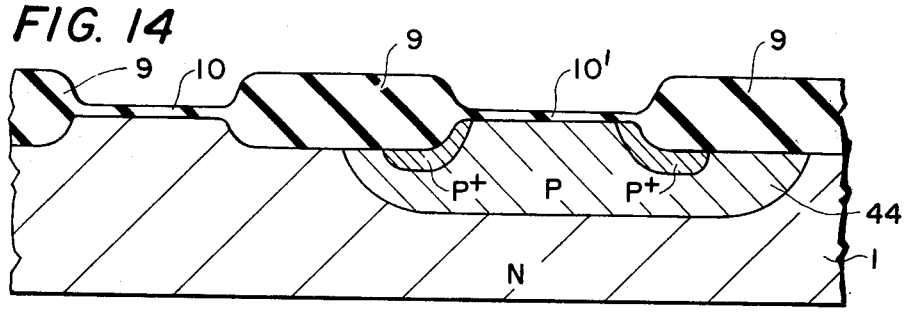

(5) After the removal of the photoresist film 6, the Si substrate 1 is heated in an O$_2$ atmosphere at 1000° C. for about 2 hours, so that the P+ type channel stoppers 7 are spread and diffused as shown in FIG. 14. Then, the Si substrate 1 is further heated in a wet O$_2$ atmosphere at 1000° C. for about 4 hours. In consequence, the SiO$_2$ films 2 and 22 not covered by the Si$_3$N$_4$ film 5 are rendered thicker so as to constitute a field oxide film 9 (SiO$_2$ film) of 0.9 to 1.4μ thick. Namely, a field oxide film 9 with the mask constituted by the Si$_3$N$_4$ film 5 is formed. Thereafter, the Si$_3$N$_4$ film 5 and the thin SiO$_2$ film 22 are removed to expose the surfaces of the Si substrate 1 and the P type well region 44.

Subsequently, SiO$_2$ films 10 and 10' as the gate insulating films are formed on the exposed surface of the Si substrate 1 and on the exposed surface of the P type well region 44. The SiO$_2$ films 10 and 10' preferably have thicknesses of about 500 to 1000 Å, preferably about 530 Å.

Figure 15:
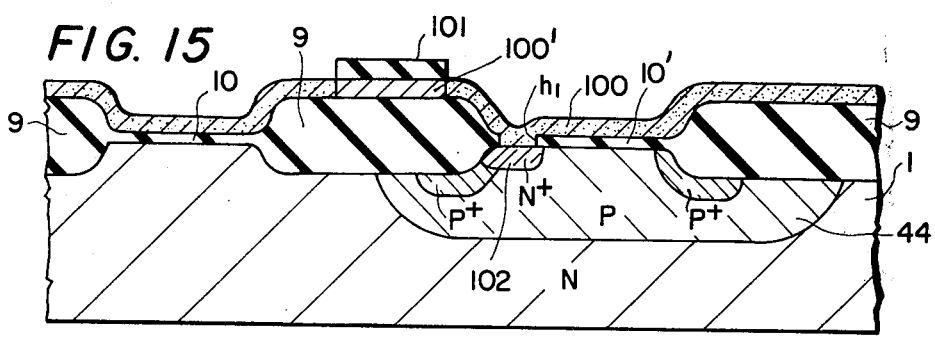

(6) Referring now to FIG. 15, after exposing the surface of the Si substrate 1 by a selective etching of the SiO$_2$ film 10' to form a hole h, a polycrystalline Si layer 100 is formed on the entire surface of the Si substrate 1 by means of a known vapor growth method. Then, in order to form a resistance in a part of the polycrystalline Si layer 100, an SiO$_2$ film 101 about 1500 Å thick is selectively formed on a portion of the polycrystalline Si layer 100. Then, the Si substrate 1 is subjected to a phosphorus treatment which is conducted at 1000° C. for about 30 minutes. As a result of this phosphorus treatment, the phosphorus impurities are introduced into the polycrystalline Si layer 100 other than the portion 100' thereof covered by the SiO$_2$ film 101. The phosphorus impurities are introduced also into the P type well region 44 through the hole h$_1$ of the SiO$_2$ film 10' so as to form an N+ type region 102.

Figure 16:
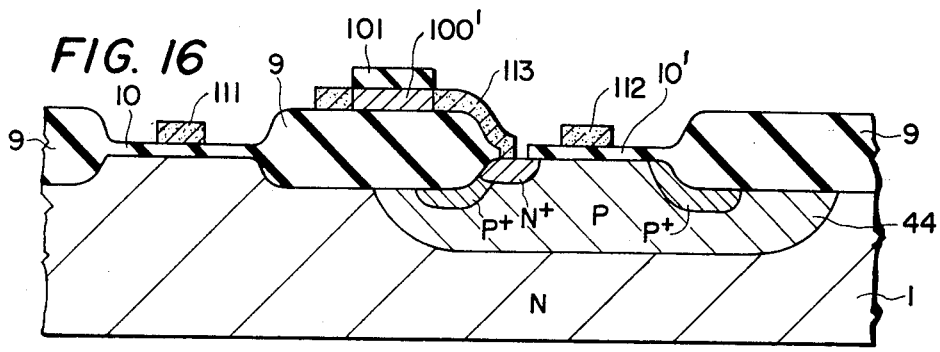

(7) The polycrystalline Si layer 100 is selectively etched by the known etching method, so that gate electrodes 111 and 112, resistance layer 100' and a conduction layer 113 are formed, as shown in FIG. 16.

(8) Referring to FIG. 17, in order to expose the portions of the surface of Si substrate 1 where the source and drain regions are to be formed, the Si substrate 1 is immersed in the etching liquid for the SiO$_2$ film thereby completely removing the portions of the SiO$_2$ films 10 and 10' other than the portions underlying the gate electrodes 111 and 112.

(9) The area where the N channel MISFET is to be formed and the resistance layer 100' are coated with an SiO$_2$ film 14 1500 Å thick as shown in FIG. 18. Thereafter, the exposed portions of the surface of Si substrate 1 on which the source and drain regions are to be formed are coated with P type impurities deposited thereon, and the impurities are further spread and diffused into the Si substrate 1. In consequence, P+ type source and drain regions 15 and 16 of a P channel MISFET is formed in the Si substrate 1. After the formation of the source and drain regions 15 and 16, the substrate 1 is exposed to a wet O$_2$ atmosphere of 830° C., so as to form a thin SiO$_2$ film 114 on the surfaces of the source and drain regions 15 and 16 and the gate electrode 11.

(10) After the removal of the SiO$_2$ film 14, a SiO$_2$ film (not shown) is formed on the gate electrode 11, source and drain regions 15 and 16, resistance layer 100' and a portion of the field oxide film 9. Then, N type impurities such as phosphorus impurities are deposited on the exposed portions where the source and drain regions are to be formed for the N-channel MISFET, and are spread and diffused into the Si substrate 1. In consequence, N+ type source and drain regions 18 and 19 of an N channel MISFET are formed in the P type well region 44 as shown in FIG. 19. After the formation of the source and drain regions 18 and 19, the Si substrate 1 is exposed to a wet O$_2$ atmosphere of about 830° C. thereby to form a thin oxide film 115 on the surfaces of the source and drain regions 18, 19, conduction layer 113 and the resistance layer 100'.

(11) Referring now to FIG. 20, after coating the entire area of the Si substrate 1 with a phosphosilicate glass (PSG) film 20, the PSG film 20 on the source and drain regions 15, 16, 18 and 19 and the SiO$_2$ films 114 and 115 are selectively etched to form windows for contacts. Then, an aluminum film of 1μ thick is formed on the surface of the Si substrate 1 by way of vacuum evaporation. This aluminum film is then selectively etched to form the drain electrodes 21, source electrodes 22 and 24 and a conduction layer M. Subsequently, the Si substrate 1 is subjected to an annealing in a hydrogen atmosphere of 450° C. for about 60 minutes, thereby to form a passivation film (PSG film) 25 on the surface of the Si substrate 1.

According to the CIGFET obtained through the method of the second embodiment, no N+ type channel stopper is formed in the N type Si substrate 1 just under the field oxide film 9, for the reason stated hereinunder.

The P type parasitic MISFET has a higher threshold voltage than the N type parasitic MISFET. Therefore, if the power source voltage employed is lower than the threshold voltage of the P type parasitic MISFET, it is not necessary to provide the N+ type channel stoppers for preventing the generation of the P type parasitic MISFET. Namely, only the P+ type channel stoppers 7 for preventing the generation of the N type parasitic MISFET is required.

Further, according to the CIGFET as obtained by the method of embodiment 2, the resistance layer 100' is connected to the drain region 19 of the N channel MISFET through the conduction layer 113 constituted by the polycrystalline Si. This resistance layer 100' is used as the load of the N channel MISFET.

Figure 21:
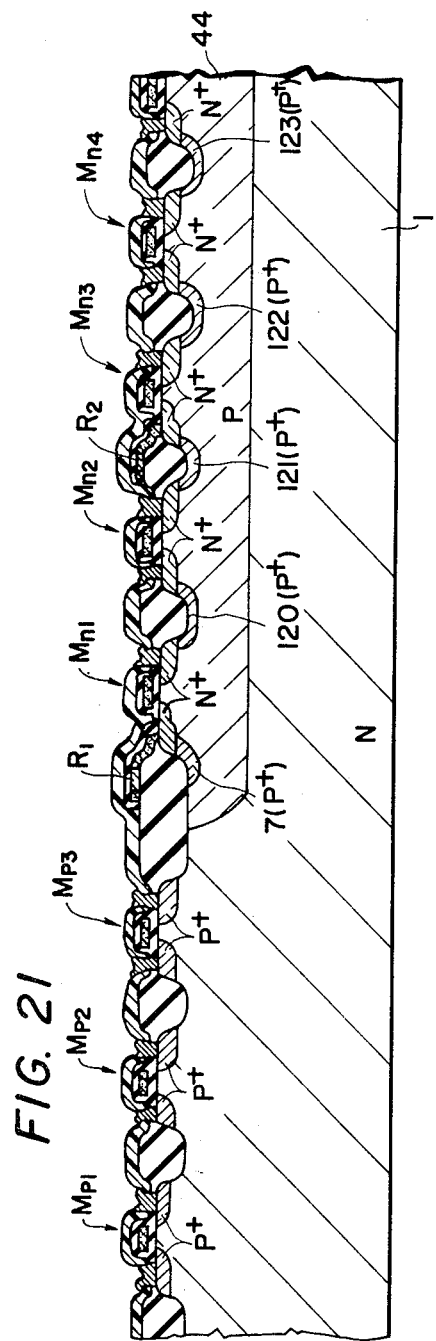
FIG. 21 is a sectional view of a semiconductor memory circuit device formed in accordance with the method of the invention.

FIG. 21 shows a semiconductor memory circuit device constituted by a plurality of CIGFETs formed in accordance with the method of embodiment 2. Each memory cell of this semiconductor memory circuit device is constituted by a plurality of N channel MISFETs forming a flip-flop and a resistance layer made of polycrystalline Si and acting as the load for the MISFETs.

In the device shown in FIG. 21, a plurality of memory cells, each having the above-described construction, are formed on the surface of one P type well region 44. The N channel MISFETs Mn1, Mn2, Mn3 and Mn4 and resistance layers R1, R2 in FIG. 21 show a part of the memory cell. P channel MISFETs Mp1, Mp2 and Mp3 show a part of the transistors which constitute a peripheral circuit such as an address circuit, a pulse generating circuit or the like.

For forming the P+ type channel stoppers 120, 121, 122 and 123 formed in the P type well region 44, only the Si$_3$N$_4$ film 5 as shown in FIG. 13 is used as the mask which determines the P+ type channel stoppers 120, 121, 122 and 123. On the other hand, for forming the P+ type channel stopper 7, the Si$_3$N$_4$ film 5 as shown in FIG. 13 and the SiO$_2$ film 2 are used as the mask for determining the P+ type channel stopper 7.

The method of the invention heretofore described offers the following advantages.

Figure 22:
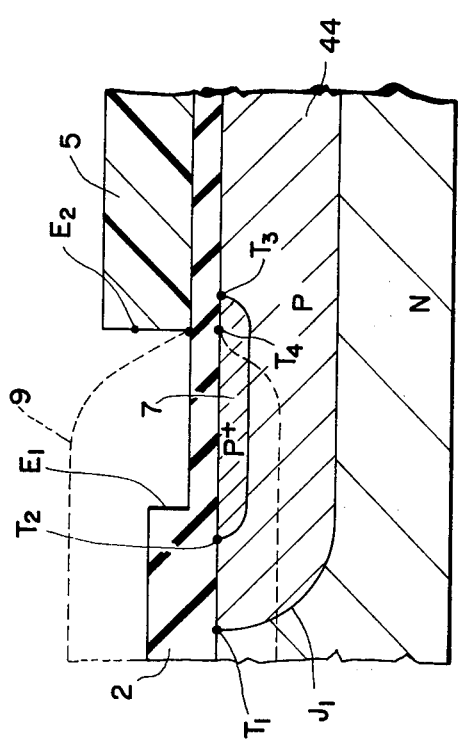
FIG. 22 is an illustration of advantages brought about by the invention.

(a) The positional relationship of the P type well region 44, P+ type region 7 (channel stopper) formed in the P type well region 44 and the field oxide film 9 in relation to one another can be determined quite easily. Namely, according to the invention, the P type well region 44 and the P+ type channel stopper 7 are determined by the edge E$_1$ of the SiO$_2$ film 2 as shown in FIG. 22. Therefore, the distance between the end T$_1$ of the PN junction (junction between substrate and well region) J$_1$ and the end T$_2$ of the P+ type channel stopper 7 is kept constant. At the same time, the edge E$_2$ of the Si$_3$N$_4$ film 5 determines the P+ type channel stopper 7 and the field oxide film 9. In consequence, the distance between the other end T$_3$ of the P+ type channel stopper 7 and the end T$_4$ of the field oxide film 9 is maintained constant.

(b) As will be clear from the above explanation, the photoresist film for determining one end T$_2$ of the P+ channel stopper 7 can be completely eliminated. The photoresist treatment, therefore, is not necessary.

(c) It is quite beneficial that the concentration of the impurities in the channel stopper surface can optionally be changed by changing the dosage in the ion implantation. Namely, the threshold voltage of the parasitic MISFET can be changed through the control of the dosage in the ion implantation. This in turn permits a free choice of operation voltage, i.e. the power supply voltage. In addition, it is possible to freely form the conduction layer on the field oxide film, irrespective of the power supply voltage, so that the density of integration of the semiconductor device is considerably improved.

(d) According to the first embodiment, as will be seen from FIG. 4, the N+ type channel stopper 8 is determined by the edges E$_2$ and E$_3$. Therefore, the P+ type channel stopper 7 and the N+ type channel stopper 8 are precisely located relatively to each other. In addition, the field oxide film 9 is determined by the Si$_3$N$_4$ film 5 which acts as the mask. (See FIG. 5). As a result, the P+ type channel stopper 7, the N+ type channel stopper 8 and the field oxide film 9 are located precisely and surely in relation to one another, which in turn affords a further increase of the density of integration of the semiconductor device.

What we claim is:

1. A method of fabricating a semiconductor device having a channel stopper for preventing the generation of a parasitic channel region at the surface of a semiconductor substrate comprising the steps of:

forming a first film selectively over the surface of a semiconductor substrate of a first conductivity type;

introducing first impurities into a first surface portion of said semiconductor substrate which is not covered by said first film to selectively form a first semiconductor region of a second conductivity type opposite to said first conductivity type in said semiconductor substrate;

forming a second film selectively over the surface of said first semiconductor region spaced apart from said first film;

introducing second impurities into a first surface portion of said first semiconductor region which is not covered by said first and second films to selectively form a second semiconductor region of the second conductivity type, said second semiconductor region being defined by said first and second films in said first semiconductor region; and selectively oxidizing the surface of at least said second semiconductor region which are not covered by said first and said second films to form an oxide film;

wherein said second semiconductor region is used as a channel stopper to prevent the generation of a parasitic channel region at the surface of said first semiconductor region caused by a wiring layer subsequently formed and overlying said first semiconductor region.

2. A method as claimed in claim 1, wherein a third film is interposed between said first semiconductor region and said second film.

3. A method as claimed in claim 2, wherein said first and third films are silicon oxide films, while said second film is a silicon nitride film.

4. A method as claimed in claim 1, wherein said second impurities are introduced into said first semiconductor region by an ion implantation.

5. A method as claimed in claim 1, wherein third impurities of the first conductivity type are introduced into a second surface portion of said first semiconductor region so as to selectively form source and drain regions of an insulated gate field effect transistor, and fourth impurities of the second conductivity type are introduced into a second surface portion of said semiconductor substrate so as to selectively form source and drain regions of another insulated gate field effect transistor.

6. A method of fabricating a semiconductor device having channel stoppers for preventing the generation of parasitic channel regions at respective surfaces of a semiconductor substrate comprising the steps of:
selectively forming a first film over a semiconductor substrate of a first conductivity type;
introducing first impurities into said semiconductor substrate which is not covered by said first film to selectively form a first semiconductor region of a second conductivity type opposite to said first conductivity type, said first semiconductor region being defined by said first film in said semiconductor substrate;
selectively forming a second and a third film over said first semiconductor region and said first film, respectively;
introducing second impurities into said first semiconductor region which is not covered by said first and second films to selectively form a second semiconductor region of the second conductivity type, said second semiconductor region being defined by said first and second films in said first semiconductor region;
introducing third impurities into said first semiconductor region which is not covered by said second film and said semiconductor substrate which is not covered by said third film to selectively form a third semiconductor region of the first conductivity type in said semiconductor substrate; and
oxidizing the surfaces of said second and third semiconductor regions using said second and third films as masks to form an oxide film;
wherein said second and third semiconductor regions are used as channel stoppers to prevent the generation of parasitic channel regions at the surfaces of said first semiconductor region and semiconductor substrate, respectively, caused by a wiring layer subsequently formed and overlying said first semiconductor region and said semiconductor substrate in the semiconductor device.

7. A method as claimed in claim 6, wherein a fourth film is interposed between said first semiconductor region and said second film.

8. A method as claimed in claim 7, wherein said first and fourth films are silicon oxide films, while each said second and third film is made of a silicon nitride film.

9. A method of fabricating complementary insulated gate field effect transistors comprising the steps of:
forming a first conductivity type silicon substrate having a first silicon oxide selectively formed on the surface thereof;
forming in the silicon substrate which is not covered with said first silicon oxide film, a first silicon region of a second conductivity type opposite to the first conductivity type covered with a second silicon oxide film having a thickness smaller than that of said first silicon oxide film;
selectively forming a first and a second silicon nitride film on said silicon substrate and said first silicon region which are covered, respectively, with the first and second silicon oxide films;
implanting second conductivity type impurity ions into said first silicon region through said second silicon oxide film which is not covered with said second silicon nitride layer, thereby to form a second silicon region of said second conductivity type in said first silicon region;
heat-oxidizing said silicon substrate thereby to form a third silicon oxide film on the portion of said silicon substrate and said second silicon region which is not covered with said first and second silicon nitride films;
removing said first and second silicon nitride films;
forming a second conductivity type channel metal-insulator-semiconductor field effect transistor at the portion of said silicon substrate which is not covered with said third silicon oxide film; and
forming a first conductivity type channel metal-insulator-semiconductor field effect transistor at the portion of said first silicon region which is not covered with said third silicon oxide film.

10. A method as claimed in claim 9, comprising the step of forming a conduction layer on said third silicon oxide film.

11. A method as claimed in claim 9, comprising the step of implanting first conductivity type impurity ions into portions of said silicon substrate and said first silicon region which are not covered by said first and second nitride films thereby to form a third silicon region of said first conductivity type having a surface impurity concentration lower than that of said second silicon region.

12. A method as claimed in claim 11, comprising the steps of forming a conduction layer on said third silicon oxide film.

13. A method as claimed in claims 1, 6 or 9, wherein the step of introducing first impurities into the semiconductor substrate to form the first impurity region comprises ion implanting the impurities in the substrate, and then heating the substrate to diffuse the impurities to form the first region into a well region.

14. A method of fabricating a semiconductor device comprising the steps of:
forming a semiconductor body including a semiconductor substrate, first and second films formed on the surface of said semiconductor substrate and spaced from each other, and a third film selectively formed on the portion of said surface of said semiconductor substrate between said first and second films;
introducing first impurities into the portion of said surface of said semiconductor substrate on which said first, second and third films are not formed; and
introducing second impurities to the portion of said surface of said semiconductor substrate between said first and second films.

15. A method of fabricating complementary insulated gate field effect transistors having a channel stopper for preventing the generation of parasitic insulated gate field effect transistors formed by wiring layers of the complementary insulated gate field effect transistors, comprising the steps of:

forming a first film selectively over the surface of a semiconductor substrate of a first conductivity type;

introducing first impurities into said semiconductor substrate which is not covered by said first film to selectively form the first semiconductor region of a second conductivity type opposite to the first conductivity type in said semiconductor substrate;

forming a second film selectively over the surface of said first semiconductor region and a third film selectively over the surface of the first film spaced apart from the second film;

introducing second impurities into said first semiconductor region which is not covered by said first and second films to selectively form a second semiconductor region of said second conductivity type in said first semiconductor region;

selectively oxidizing said substrate to form a fourth film on the portion of said substrate and said second semiconductor region which is not covered by said second and third films;

removing said second and third films;

forming a second conductivity type channel metal-insulator-semiconductor field effect transistor at the portion of said silicon substrate which is not covered with said fourth film; and forming a first conductivity type channel metal-insulator-semiconductor field effect transistor at the portion of said first semiconductor region which is not covered with said fourth oxide film;

wherein the second semiconductor region is a channel stopper to prevent the generation of a parasitic insulated gate field effect transistor of the first conductivity type formed by a wiring wiring layer.

16. A method as claimed in claim 15, comprising the step of implanting first conductivity type impurity ions into portions of said substrate and said first semiconductor region which are not covered by said second and third films thereby to form a third semiconductor region of said first conductivity type having a surface impurity concentration lower than that of said second semiconductor region and higher than that of said semiconductor substrate, which third region is a channel stopper to prevent the generation of a parasitic insulated gate field effect transistor of the second conductivity type formed by the wiring layer.

* * * * *